(12) United States Patent
Yamada et al.

(10) Patent No.: US 10,644,388 B2
(45) Date of Patent: May 5, 2020

(54) WIRELESS MODULE, PRINTED CIRCUIT BOARD, AND METHOD

(71) Applicant: KABUSHIKI KAISHA TOSHIBA, Minato-ku (JP)

(72) Inventors: Keiju Yamada, Yokohama (JP); Makoto Sano, Kawasaki (JP); Makoto Higaki, Setagaya (JP); Koh Hashimoto, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 68 days.

(21) Appl. No.: 16/126,189

(22) Filed: Sep. 10, 2018

(65) Prior Publication Data

US 2019/0214716 A1 Jul. 11, 2019

(30) Foreign Application Priority Data

Jan. 10, 2018 (JP) .................................. 2018-002148

(51) Int. Cl.
*H01Q 13/10* (2006.01)
*H01Q 1/38* (2006.01)
(Continued)

(52) U.S. Cl.
CPC ............. *H01Q 1/38* (2013.01); *H01L 21/561* (2013.01); *H01L 23/49838* (2013.01);
(Continued)

(58) Field of Classification Search
CPC ........ H01Q 1/38; H01Q 13/08; H01Q 13/102; H01Q 13/16; H01Q 1/2283; H01L 21/561; H01L 23/552
(Continued)

(56) References Cited

U.S. PATENT DOCUMENTS 7,999,753 B2 * 8/2011 Gaucher ................... H01Q 1/38
343/828
9,166,298 B2 10/2015 Hashimoto et al.
(Continued)

FOREIGN PATENT DOCUMENTS

JP 2012-70253 4/2012
JP 2013-179449 9/2013
(Continued)

*Primary Examiner* — Huedung X Mancuso
(74) *Attorney, Agent, or Firm* — Oblon, McClelland, Maier & Neustadt, L.L.P.

(57) ABSTRACT

The wireless module according to an aspect of the present invention includes a board, a wireless communication chip that at least transmits or receives a high-frequency signal, an insulator, a conductive film, a feed line, first to third conductor patterns, and first and second vias. The chip, the feed line, and the first and second patterns are located on a first wiring layer of the board. The third pattern is at a ground potential and is located on a second wiring layer of the board. The insulator encapsulates the chip. The film covers at least a part of a side surface of the insulator. The feed line electrically connects the chip and the film. The first and second patterns are in contact with the film. The first via connects the first pattern and the third pattern. The second via electrically connects the second pattern and the third pattern.

16 Claims, 9 Drawing Sheets

(51) Int. Cl.
*H01L 23/552* (2006.01)
*H01Q 1/22* (2006.01)
*H01L 21/56* (2006.01)
*H01Q 13/08* (2006.01)
*H01L 23/498* (2006.01)
*H01Q 13/16* (2006.01)
*H01L 23/31* (2006.01)

(52) U.S. Cl.
CPC ......... *H01L 23/552* (2013.01); *H01Q 1/2283* (2013.01); *H01Q 13/08* (2013.01); *H01Q 13/103* (2013.01); *H01Q 13/16* (2013.01); *H01L 23/3121* (2013.01)

(58) Field of Classification Search
USPC ........................................................ 343/767
See application file for complete search history.

(56) References Cited

U.S. PATENT DOCUMENTS

| | | | |
|---|---|---|---|
| 9,184,492 B2 | 11/2015 | Tsutsumi et al. | |
| 9,793,202 B1 | 10/2017 | Hashimoto et al. | |
| 9,935,065 B1* | 4/2018 | Baheti | H01L 23/66 |
| 2006/0091523 A1* | 5/2006 | Shimanuki | H01L 23/49816 |
| | | | 257/698 |
| 2011/0309893 A1* | 12/2011 | Kawamura | H01L 23/48 |
| | | | 333/104 |
| 2012/0015687 A1* | 1/2012 | Yamada | H01L 23/3128 |
| | | | 455/550.1 |
| 2012/0119969 A1* | 5/2012 | MacDonald | H01L 23/66 |
| | | | 343/841 |
| 2013/0222196 A1 | 8/2013 | Hashimoto et al. | |
| 2014/0325150 A1 | 10/2014 | Hashimoto et al. | |
| 2018/0053987 A1 | 2/2018 | Yamada et al. | |
| 2018/0123261 A1 | 5/2018 | Sano et al. | |
| 2018/0205133 A1 | 7/2018 | Hashimoto et al. | |
| 2018/0226722 A1 | 8/2018 | Yamada et al. | |

FOREIGN PATENT DOCUMENTS

| | | |
|---|---|---|
| JP | 2014-45247 | 3/2014 |
| JP | 2014-217014 | 11/2014 |
| JP | 2018-23060 | 2/2018 |
| JP | 2018-29286 | 2/2018 |
| JP | 2018-74506 | 5/2018 |
| JP | 2018-117215 A | 7/2018 |
| JP | 2018-129596 A | 8/2018 |

* cited by examiner

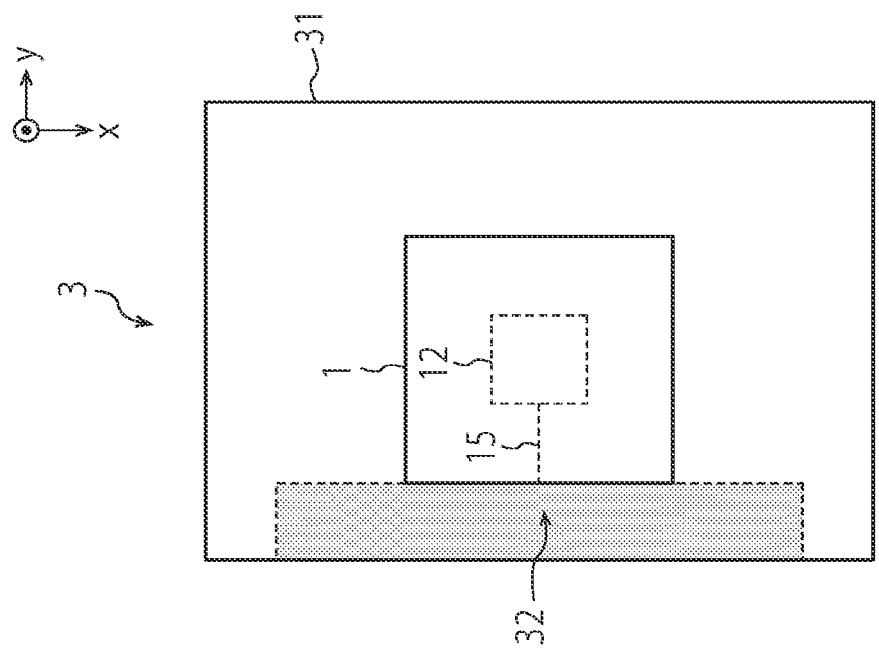
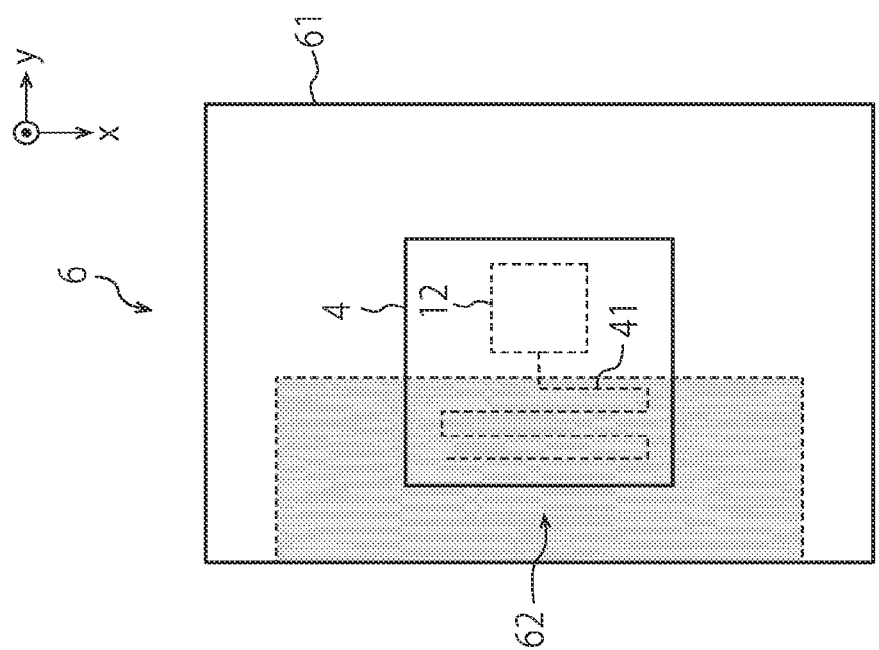

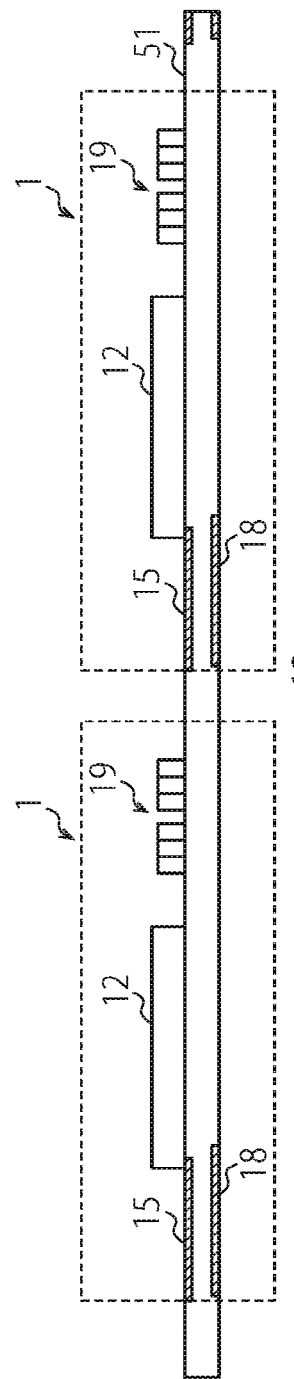
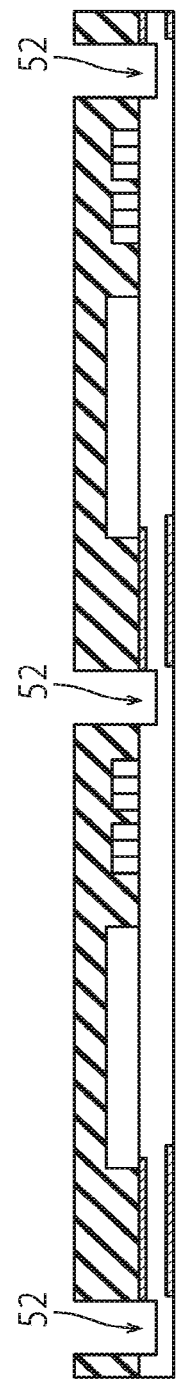
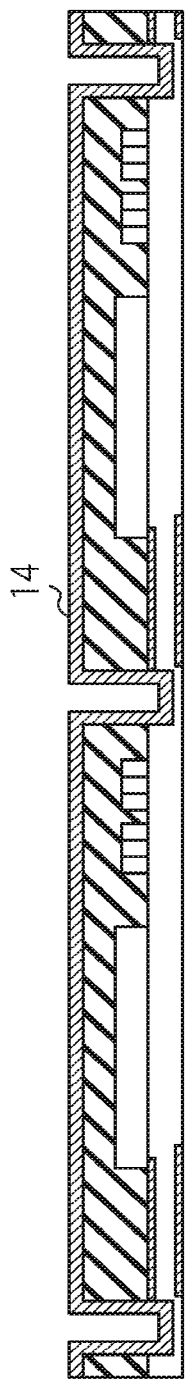
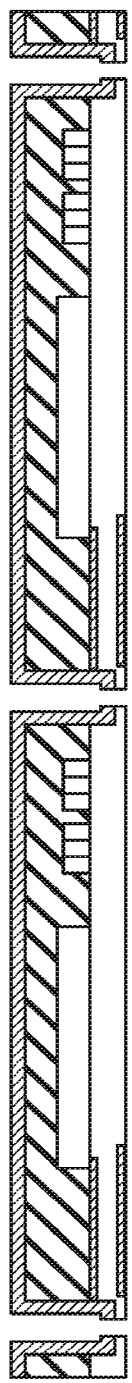

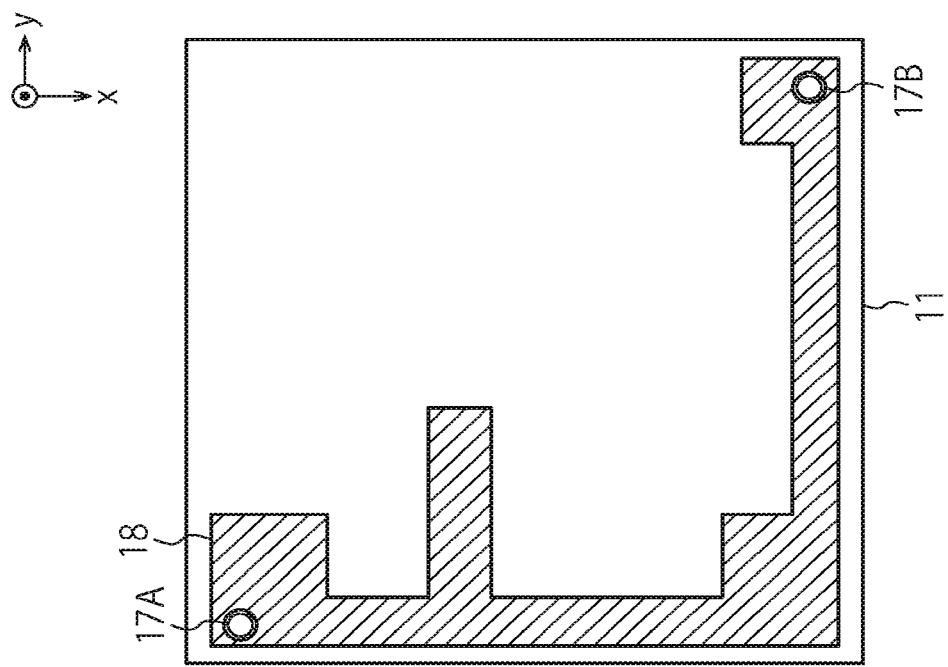
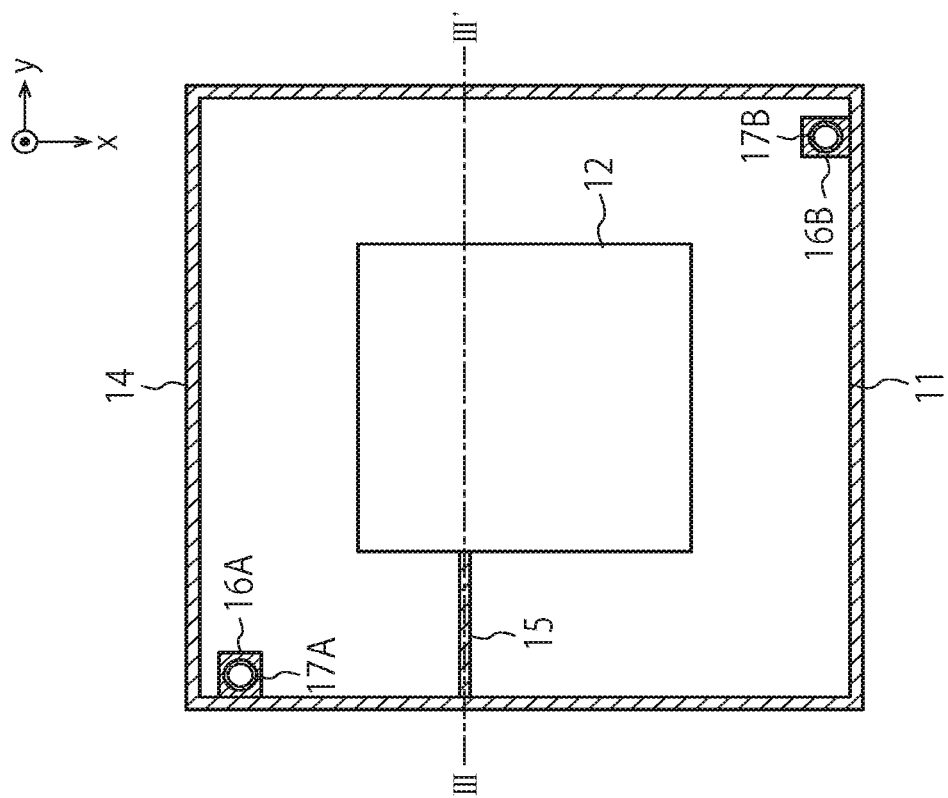
FIG. 7A
FIG. 7B

US 10,644,388 B2

WIRELESS MODULE, PRINTED CIRCUIT BOARD, AND METHOD

CROSS-REFERENCE TO RELATED APPLICATION(S)

This application is based upon and claims the benefit of priority from Japanese Patent Application No. 2018-002148, filed Jan. 10, 2018; the entire contents of which are incorporated herein by reference.

FIELD

Embodiments described herein relate generally to a wireless module, a printed circuit board, and a method.

BACKGROUND

A wiring prohibited region, where installation of an electronic component and a wiring is prohibited, is set in a printed circuit board provided with a wireless module in order to enhance radiation efficiency of an antenna. With the wiring prohibited region, design flexibility of the wireless module decreases. For example, it is necessary to consider the wiring prohibited region even if an electronic component is installed on a surface of the printed circuit board opposite to a surface provided with the wireless module in order to downsize a product.

BRIEF DESCRIPTION OF THE DRAWINGS

FIGS. 4A and 4B are top views to explain a wiring prohibited region;

FIGS. 6A to 6E are diagrams to explain processes of manufacturing the wireless module according to the first embodiment;

FIGS. 7A and 7B are diagrams to explain a wiring pattern in a wireless module according to a second embodiment;

DETAILED DESCRIPTION

An embodiment of the present invention provides a wireless module that reduces a region influenced by an antenna.

The wireless module according to an aspect of the present invention includes a board, a wireless communication chip that at least transmits or receives a high-frequency signal, an insulator, a conductive film, a feed line, first to third conductor patterns, and first and second vias. The wireless communication chip, the feed line, and the first and second conductor patterns are located on a first wiring layer of the board. The third conductor pattern is at a ground potential and is located on a second wiring layer of the board. The insulator encapsulates the wireless communication chip. The conductive film covers at least a part of a side surface of the insulator. The feed line electrically connects the wireless communication chip and the conductive film. The first and second conductor patterns are in contact with the conductive film. The first via connects the first conductor pattern and the third conductor pattern. The second via electrically connects the second conductor pattern and the third conductor pattern.

Below, a description is given of embodiments of the present invention with reference to the drawings. The present invention is not limited to the embodiments.

First Embodiment

Figure 1:
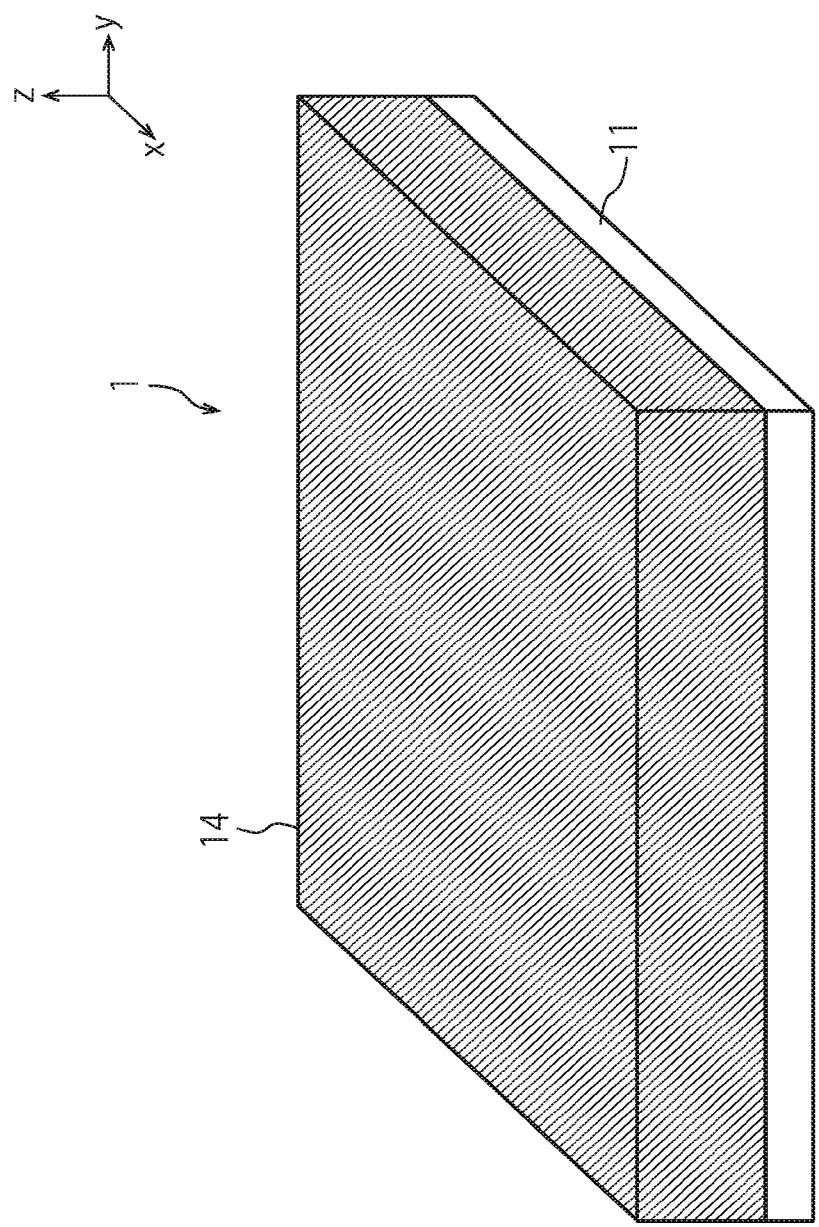
FIG. 1 is a perspective view illustrating a wireless module according to a first embodiment.
Figure 2B:
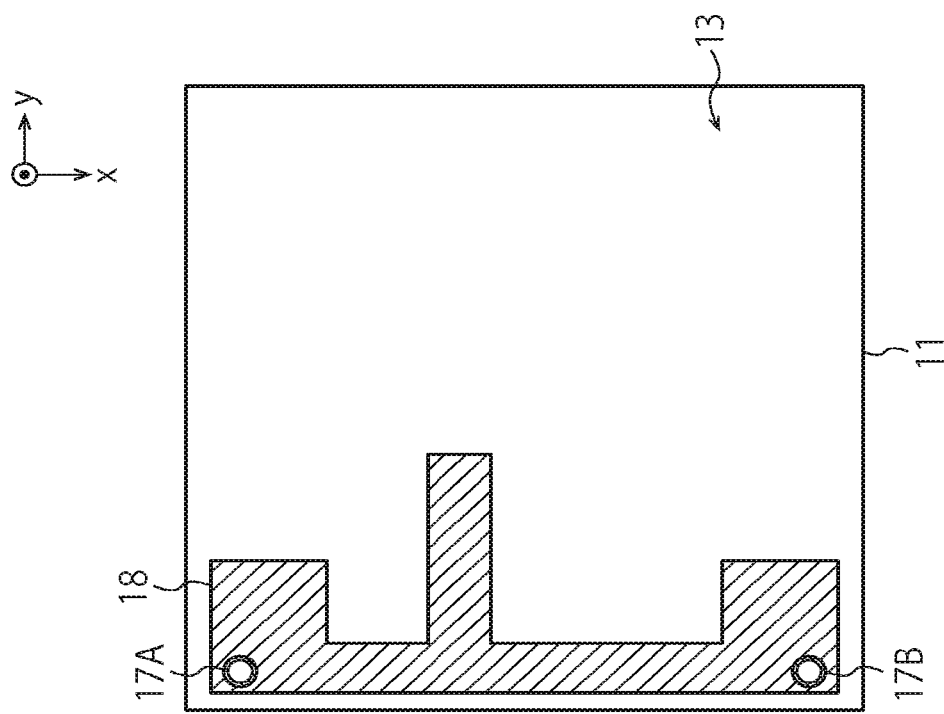
FIGS. 2A and 2B are diagrams each illustrating a wiring pattern in the wireless module according to the first embodiment.
Figure 2A:
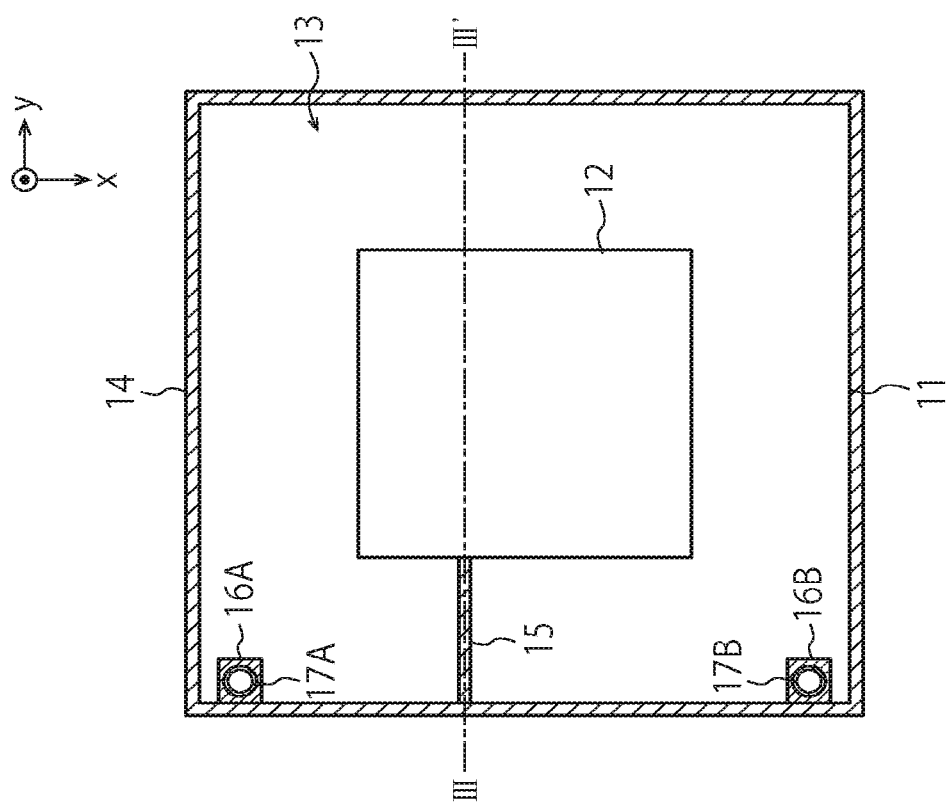

FIG. 1 is a perspective view illustrating a wireless module according to a first embodiment. FIGS. 2A and 2B are diagrams each illustrating a wiring pattern in the wireless module according to the first embodiment. FIG. 2A is a cross-sectional view parallel to an x-y plane that passes through a first wiring layer. FIG. 2B is a cross-sectional view parallel to an x-y plane that passes through a second wiring layer. A wireless module 1 according to the first embodiment includes an interposer board 11, a semiconductor chip 12, an insulator 13, and a conductive film 14. Further, the wireless module 1 includes, as a part of a wiring pattern of the interposer board 11, a feed line 15, first layer conductor patterns 16, vias 17, and a second layer conductor pattern 18.

Incidentally, an alphabet suffixed to a reference numeral is added to distinguish between entities with the same reference numeral. As illustrated in FIG. 2A, the wireless module 1 includes at least two first layer conductor patterns 16, namely, a first layer conductor pattern 16A (first conductor pattern) and a first layer conductor pattern 16B (second conductor pattern). Further, the wireless module 1 includes at least two vias 17, namely, a via 17A and a via 17B.

In the description, a direction in which the semiconductor chip 12 is viewed from the interposer board 11 is defined as "up" direction, and an opposite direction is defined as "down" direction. In other words, a positive direction of a z-axis in an orthogonal coordinate system illustrated in FIGS. 1, 2A, and 2B corresponds to the up direction. Further, a positive direction of an x-axis in the orthogonal coordinate system is defined as "front" direction, and a negative direction thereof is defined as "rear" direction. Moreover, a positive direction of a y-axis in the orthogonal coordinate system is defined as "right" direction, and a negative direction thereof is defined as "left" direction.

The interposer board 11 includes at least the first wiring layer and the second wiring layer each provided with the wiring pattern. In other words, the interposer board 11 may be a two-layer board (double-sided board) or a multilayer board. In a case where the interposer board 11 is the two-layer board, the first wiring layer is a surface layer on the insulator 13 side, and a surface of the interposer board 11 on electrode side is the second wiring layer. In contrast, in a case where the interposer board 11 is the multilayer board, it is unnecessary to arrange the first wiring layer and the second wiring layer on the surface layer of the interposer board.

Incidentally, a board commonly used as a printed circuit board may be used for the interposer board 11. Examples of a base material of the interposer board 11 include insulators such as FR-4 (Flame Retardant Type-4: glass-fabric-based epoxy resin) or ceramic. Further, it is presumed that the interposer board 11 includes a plurality of wiring layers, two solder resist layers, and the like. Incidentally, using the interposer board is presumed in the description with consideration of actual use. However, effects similar to effects achieved by the wireless module 1 are achievable even when a board other than the interposer board is used. Accordingly, a board other than the interposer board may be used.

The semiconductor chip 12 is a chip that has a function of, e.g. a high-frequency circuit and an analog-to-digital converter for wireless communication. The semiconductor chip 12 at least transmits or receives a high-frequency signal. The semiconductor chip 12 may include a processor such as a CPU, a random access memory, a flash memory, and the like as necessary. The semiconductor chip 12 is mounted on the interposer board 11.

The semiconductor chip 12 may be flip-chip bonded on the interposer board 11 by, for example, solder balls. Further, the semiconductor chip 12 may be bonded, by a die attach material, on the interposer board 11 in a face-up manner. Incidentally, in a case where the semiconductor chip 12 is mounted on the interposer board 11 in a face-up manner, a wiring to the semiconductor chip 12 and a preset wiring of the interposer board 11 are electrically connected by wire bonding.

Incidentally, an electronic component other than the semiconductor chip 12 may be mounted on the interposer board 11. For example, passive components (such as a capacitor, an inductor, and a resistor) and a crystal oscillator may be mounted. The electronic component other than the semiconductor chip 12 is also joined to the interposer board 11 by surface mounting.

The insulator 13 encapsulates the semiconductor chip 12 and the like located on the first wiring layer together with the first wiring layer in order to seal the semiconductor chip 12 and the like. An insulator commonly used as a sealing resin, e.g. an epoxy resin, may be used as the insulator 13.

The conductive film 14 prevents an unnecessary electromagnetic wave radiated from the semiconductor chip 12, the wiring pattern of the interposer board 11, etc. from being leaked to outside of the wireless module 1. In other words, the conductive film 14 is a shield layer covering the insulator 13. Incidentally, the conductive film 14 covers a top surface and four side surfaces of the insulator 13 in FIG. 1. In such a case, the conductive film 14 may be connected to a ground wiring (GND wiring) on the side surfaces of the interposer board 11, which makes it possible to further enhance the shield effect.

Unlike FIG. 1, the conductive film 14 may cover a part of the surface of the insulator 13. In other words, an uncovered part which is not covered with the conductive film 14 may be present on an outer surface of the insulator 13 depending on specification of the wireless module 1 or the like.

The conductive film 14 is made of a conductor that has electric conductivity higher than a predetermined value. For example, the conductive film 14 may be made of gold, silver, or copper that are conductors each having electric conductivity higher than $1.0 \times 10^6$ [S/m]. Alternatively, the conductive film 14 may be made of an alloy or a conductive paste having high electric conductivity.

In order to improve adhesiveness between the insulator 13 and the conductive film 14 or to prevent oxidation, a conductive film different from the conductive film 14 may be newly provided. For example, a film made of stainless steel (SUS), titanium and the like may be provided on an interface between the insulator 13 and the conductive film 14 or provided on the conductive film 14.

Next, the wiring pattern of the interposer board 11 will be descried.

As illustrated in FIG. 2A, the semiconductor chip 12, the feed line 15, and the first layer conductor patterns 16 are located on the first wiring layer. Further, FIG. 2A illustrates cross-sections of the respective vias 17 in the first wiring layer. As illustrated in FIG. 2B, the second layer conductor pattern 18 (third conductor pattern) is located on the second wiring layer. Further, FIG. 2B illustrates the cross-sections of the respective vias 17 in the second wiring layer. Incidentally, the side surfaces of the interposer board 11 are in contact with the conductive film 14 in the first wiring layer. In contrast, the side surfaces of the interposer board 11 are not in contact with the conductive film 14 in the second wiring layer.

The feed line 15 is a part of the wiring pattern of the first wiring layer. One end of the feed line 15 is connected to an electrode of the semiconductor chip 12, and the other end is connected to the conductive film 14. Accordingly, the feed line 15 electrically connects the semiconductor chip 12 and the conductive film 14, and transmits the high-frequency signal from the semiconductor chip 12 to the conductive film 14.

The first layer conductor patterns 16 are parts of the wiring pattern of the first wiring layer. One end of each of the first layer conductor patterns 16 is connected to the conductive film 14. Further, each of the first layer conductor patterns 16 is electrically connected to the second layer conductor pattern 18 through the corresponding via 17. In FIG. 2A, the first layer conductor pattern 16A is electrically connected to the second layer conductor pattern 18 through the via 17A. The first layer conductor pattern 16B is electrically connected to the second layer conductor pattern 18 through the via 17B.

The vias 17 penetrate at least between the first wiring layer and the second wiring layer, and electrically connect the first layer conductor patterns 16 and the second layer conductor pattern 18.

The second layer conductor pattern 18 is a part of the wiring pattern of the second wiring layer. The second layer conductor pattern 18 includes a region of the via 17A in the second wiring layer and a region of the via 17B in the second wiring layer. The second layer conductor pattern 18 includes an end part that extends along a part of at least one of the side surfaces of the interposer board 11. In FIG. 2B, the second layer conductor pattern 18 includes an end part extending along a left side surface of the interposer board 11. A length of a gap between an end part of the interposer board 11 and the end part of the second layer conductor pattern 18 may be adjusted according to the high-frequency signal supplied from the semiconductor chip 12. A shape of a part other than the end part of the second layer conductor pattern 18 may be determined as appropriate.

The second layer conductor pattern 18 serves as a GND wiring. That is, a potential of the second layer conductor pattern 18 is set to a GND potential. Accordingly, a potential of a connection point between the conductive film 14 and the first layer conductor pattern 16 also become the GND potential through the first layer conductor patterns 16 and the vias 17.

When the high-frequency signal is supplied from the semiconductor chip 12 to the conductive film 14 through the feed line 15 in such a configuration, potential difference occurs inside the conductive film 14. As a result, a slot antenna that is made up of the conductive film 14, the via 17A, the via 17B, and the second layer conductor pattern 18 is formed.

Figure 3A:
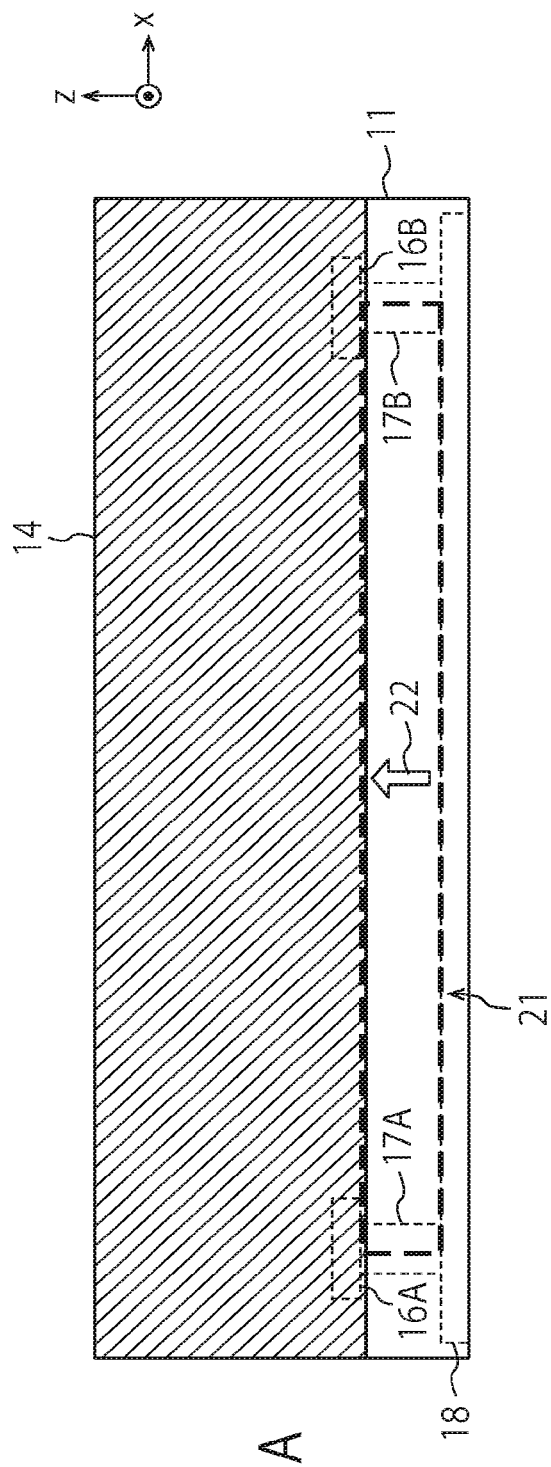
FIGS. 3A and 3B are diagrams to explain a slot antenna formed in the first embodiment.
Figure 3B:
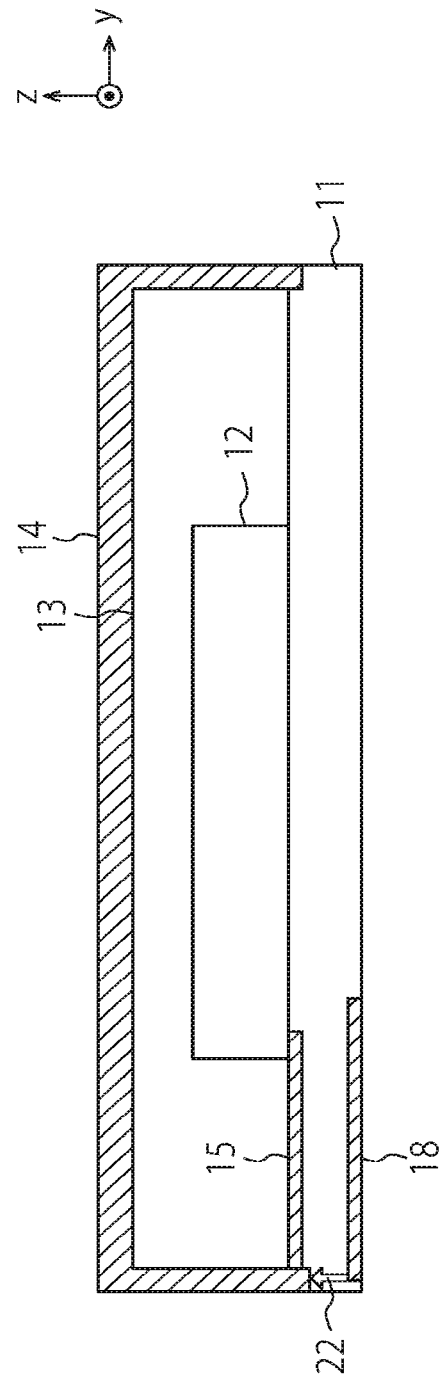

FIGS. 3A and 3B are diagrams to explain the slot antenna formed in the first embodiment. FIG. 3A is a left side view of the wireless module 1. FIG. 3B is a vertical cross-sectional view of the wireless module 1. A position of cutting in the cross-sectional view of FIG. 3B is illustrated by a line III-III' in FIG. 2A. Incidentally, in FIG. 3A, the first layer conductor patterns 16, the vias 17, and the second layer conductor pattern 18 are illustrated by thin dashed lines for convenience of description though these components are actually invisible from outside.

In FIG. 3A, a region illustrated by a thick dashed line indicates a slot antenna region 21. The region includes an end part of the conductive film 14, the via 17A, the end part of the second layer conductor pattern 18, and the via 17B. In the example of FIGS. 3A and 3B, the slot antenna region 21 is on left side surface side because the feed line 15 and the conductive film 14 are connected on the left side surface of the interposer board 11. An electric field, which is generated in the slot antenna region 21, is excited by the high-frequency signal from the feed line 15 with these components, and an electromagnetic wave is accordingly radiated.

An arrow illustrated in each of FIGS. 3A and 3B indicates a direction of an electric field 22 of the slot antenna. As illustrated, the excited electric field 22 has a main part in a direction perpendicular to the wiring layer of the interposer board 11.

Incidentally, a resonance frequency of the slot antenna is mainly influenced by a length in a longitudinal direction of the slot antenna. Accordingly, adjusting the positions of the respective vias 17A and 17B makes it possible to adjust the resonance frequency of the slot antenna. For example, in a case where relative permittivity of the base material of the interposer board 11 is 4.7 and the distance between the via 17A and the via 17B is 9.0 mm, the slot antenna resonates at about 7.7 GHz. When a use requires that the resonance frequency of the slot antenna is within a high-frequency band, the slot antenna can be arranged with the configuration in which the conductive film 14 convers all of the side surfaces of the insulator 13.

In the present embodiment, the electric field that is perpendicular to the wiring layer of the interposer board 11 and that is occurred on the side surface of the wireless module 1 is a main part as illustrated in FIGS. 3A and 3B. The electric field parallel to the wiring layer is weak, and the electromagnetic wave radiated downward from the module is also weak. Accordingly, the wiring prohibited region provided on the printed circuit board provided with the wireless module 1 according to the present embodiment can be made smaller than that of a common wireless module.

In the printed circuit board provided with the wireless module, the wiring prohibited region is set in order to reduce coupling of the antenna and the conductor pattern of the printed circuit board and to secure favorable radiation characteristics of the antenna. In the wiring prohibited region, installation of an electronic component and wiring is prohibited. If the wiring prohibited region is larger, the wiring prohibited region inhibits downsizing and the like of the product. For example, if the electric field parallel to the interposer board 11 or the wiring layer is strong, the electromagnetic field radiated downward from the module is strengthened which results in a wide wiring prohibited region. In the wireless module 1 according to the present embodiment, however, the electromagnetic wave radiated downward from the module is weak, and the electromagnetic field radiated in a direction perpendicular to the side surface of the wireless module 1 is strong. This makes it possible to reduce the wiring prohibited region.

FIGS. 4A and 4B are top views to explain the wiring prohibited region. A wireless module mounted on a printed circuit board 6 in FIG. 4A is a standard wireless module 4. A wireless module mounted on a printed circuit board 3 in FIG. 4B is the wireless module 1 according to the present embodiment.

In the standard wireless module 4, a linear antenna such as a meandering antenna is used as an antenna portion 41 as illustrated in FIG. 4A. The antenna portion 41 occupies a predetermined area of the wiring layer. An occupancy area of the antenna portion 41 in the wiring layer is about 30% to about 50% in many cases.

The antenna portion 41 included in the standard wireless module 4 has a property in which radiation efficiency is reduced when a conductor is arranged around the antenna portion 41. Accordingly, it is necessary to provide a wiring prohibited region 62 with a wide area that includes a part of a printed wiring board 61 directly below the antenna portion 41 as illustrated in FIG. 4A. In contrast, the slot antenna in the wireless module 1 according to the present embodiment does not strongly perform radiation on printed wiring board 31 side as illustrated in FIG. 4B. Therefore, it is unnecessary to provide the wiring prohibited region in the printed wiring board 31 directly below the wiring communication module 1. As a result, the wiring prohibited region can be arranged like a wiring prohibited region 32, and is made smaller in the wiring communication module 1 according to the present embodiment. When the side surface having the formed slot antenna is separated by 1 mm or lower from an outer periphery of the printed wiring board 31 without being arranged as illustrated in FIGS. 4A and 4B, it is possible to further reduce the wiring prohibited region.

Figure 5:
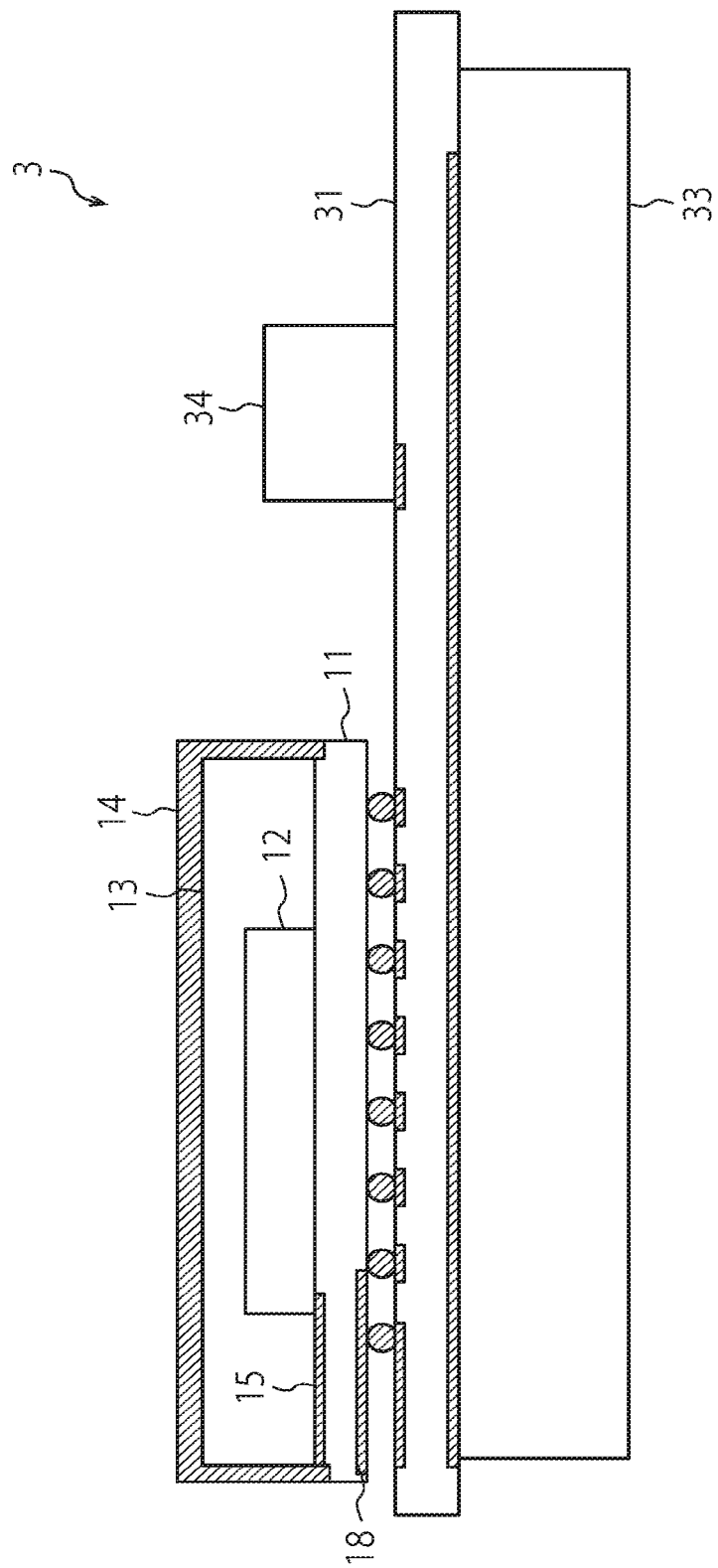
FIG. 5 is a vertical cross-sectional view illustrating an example of a printed circuit board provided with the wireless module according to the first embodiment.

FIG. 5 is a vertical cross-sectional view illustrating an example of a printed circuit board provided with the wireless module according to the first embodiment. The wireless module 1 is located on a top surface (first surface) of the printed wiring board 31. Further, as electronic components other than the wireless module 1, a battery 33 and a sensor 34 are attached to the printed circuit board 3. The battery 33 is attached on a bottom surface (second surface) of the printed wiring board 31 directly below the wireless module 1.

As described above, a region directly below the wireless module 1 is not set as the wiring prohibited region unlike the standard wireless module 4. Accordingly, it is possible to arrange the electronic component at a position directly below the wireless module 1 as illustrated in FIG. 5. In other words, it is possible to freely arrange the electronic component at a position directly below the wireless module 1 on a surface opposite to the module mounting surface of the printed wiring board 31. Accordingly, using the wireless module 1 makes it possible to enhance flexibility of the wiring design of the printed wiring board and the design of the component arrangement as compared with the case of using the standard wireless module 4.

Incidentally, the wiring pattern of the wireless module 1 according to the present embodiment is excellent also in terms of reduction of the area of the interposer board 11. In view of feeding efficiency, a common feed line is preferably short-circuited to a wiring of the GND potential in the vicinity of the slot antenna, or is preferably extended to a position at a distance of about a half wavelength from the vicinity of the slot antenna and opened. However, for example, in a case where the feed line is short-circuited to the wiring of the GND potential of the other wiring layer through a via or the like, it is necessary to secure an area of a land near the via. In another case where the feed line 15 is extended and released, it is necessary to keep an arrangement area of the feed line 15. Accordingly, the area of the interposer board 11 is increased in these cases.

In contrast, the feed line 15 according to the present embodiment has only to be short-circuited to the conductive film 14 of the GND potential that forms the slot antenna. In other word, the feed line 15 according to the present embodiment has only to be arranged in contact with the shield. This makes it possible to reduce the arrangement area of the feed line 15. Accordingly, it is also possible to downsize the wireless module 1 itself.

The insulator 13 of the wireless module 1 according to the present embodiment may be all covered with the conductive film 14. This makes it possible to simplify manufacturing processes. FIGS. 6A to 6E are diagrams to explain processes of manufacturing the wireless module according to the first embodiment. The processes are performed in order of FIGS. 6A to 6E to manufacture the wireless module 1. Incidentally, an employed manufacturing method is a multi-patterned way in which a plurality of sets of components of the wireless modules 1 are arranged and assembled on one large sheet-like printed wiring board, and the printed wiring board is finally divided.

First, the wiring pattern and the electronic components are mounted on a surface of a sheet-like printed wiring board 51. FIG. 6A illustrates a state where the surface mounting has been performed. The surface mounting is performed in order of screen printing of solder, mounting of the components, and soldering by a reflow method (hereinafter, simply referred to as reflow). Incidentally, in a case where the semiconductor chip 12 includes a chip size package, the semiconductor chip 12 may be joined to the printed wiring board 51 in the reflow process. In a case where the semiconductor chip 12 is bonded on the printed wiring board 51 by a die attach material and electronic connection is obtained by wire bonding, a process of die mounting and a process of wire bonding are performed after the surface mounting is performed. As a result, as illustrated by dashed frames in FIG. 6A, the sets of components of the wiring communication modules 1 are spaced at a predetermined interval on the one sheet-like printed wiring board 51. Incidentally, each of the sets of components in the example of FIGS. 6A to 6E includes the semiconductor chip 12, the feed line 15, the first layer conductor patterns 16A and 16B, the vias 17A and 17B, the second layer conductor pattern 18, and other electronic components 19.

Subsequently, the insulator 13 is formed by a method such as transfer molding and compression molding, and the semiconductor chip 12 and the like are sealed by the insulator 13. FIG. 6B illustrates a state where the sealing has been performed.

Subsequently, half cutting is performed with use of a dicer or the like. The half cutting is performed in order to form a groove (cut line) 52 to such a degree that separation of the sheet-like printed wiring board 51 does not occur. Here, the groove 52 that has a depth larger than a thickness of a top surface of the sheet-like printed wiring board 51 is formed, by the half cutting, at every boundary of regions provided for the respective component sets. FIG. 6C illustrates a state where the half cutting has been performed.

Subsequently, the conductive film 14 is formed on the top surface and the side surfaces of the insulator film 13, and on a part of the side surfaces of the interposer board. As a result, the shield layer is formed. A method of forming the shield layer is not particularly limited. For example, sputtering, vapor deposition, electrostatic spraying, spraying, and screen printing may be used. For example, in the case of sputtering, the shield layer is formed on a part of the side surfaces of the insulator 13 and a part of the side surfaces of the interposer board 11 due to plasma diffraction. FIG. 6D illustrates a state where the shield layer has been formed.

Finally, full cutting is performed with use of a dicer, or the like. In the full cutting, the sheet-like printed wiring board 51 is divided along the groove 52 formed by the half cutting. As a result, each of divided pieces works as the wireless module 1.

The above-described manufacturing method does not include a process dedicated for formation of the slot antenna, for example, a cutting process to provide an opening section in the conductive film 14. Accordingly, using the present manufacturing method makes it possible to efficiently manufacture the wireless module 1 according to the present embodiment.

As described above, according to the present embodiment, it is possible to form the slot antenna on the side surface of the insulator even in the case where the shield layer covers the entire side surface. This makes it possible to reduce the wiring prohibited region of the printed circuit board, and to improve flexibility of wiring arrangement. Moreover, the wireless module according to the present embodiment does not require the process dedicated for formation of the opening section in the manufacturing, and is efficiently manufacturable.

Second Embodiment

In the first embodiment, the slot antenna is formed on one side surface of the wireless module 1. In a case where the length of the wireless module 1 in the longitudinal direction is smaller than half of the wavelength of the radiated electromagnetic wave, however, the radiation efficiency may be deteriorated. For example, in a case where the length of an outer periphery of the formed slot antenna is smaller than half of the wavelength of the radiated electromagnetic wave even though the positions of the respective vias 17 are adjusted, the radiation efficiency is deteriorated. Accordingly, in the second embodiment, the slot antenna is provided so as to extend over the plurality of side surfaces of the wireless module 1 in order to secure the length of the outer periphery of the slot antenna.

FIGS. 7A and 7B are diagrams to explain a wiring pattern in a wireless module according to the second embodiment. In the example of FIGS. 7A and 7B, the slot antenna that extends over two side surfaces of a left side surface and a front side surface of the wireless module 1, is formed. FIG. 7A is a cross-sectional view of a cross-section parallel to an x-y plane in the first wiring layer. As with FIGS. 2A and 2B, illustration of the insulator 13 is omitted in FIGS. 7A and 7B. FIG. 7B is a cross-sectional view of a cross-section parallel to the x-y plane in the second wiring layer.

In the first embodiment, the first layer conductor pattern 16A and the first layer conductor pattern 16B are in contact with the conductive film 14 on the same side surface. In the second embodiment, the contact position of the first layer conductor pattern 16A is the same as the position in the first embodiment. However, the first layer conductor pattern 16B is in contact with the other side surface (front side surface in FIG. 7A). The position of the via 17B is also changed according to the position of the first layer conductor pattern 16B.

The second layer conductor pattern 18 according to the second embodiment includes an end part along the left side surface and the front side surface of the interposer board 11. As described above, the end part of the second layer conductor pattern 18 extends along two or more side surfaces. A shape of a part other than the end part may be optionally determined. The second layer conductor pattern 18 may include an L-shape as with the example of FIG. 7B, or may include a simple rectangular shape. The part other than the end part may include a complicated shape.

Figure 8:
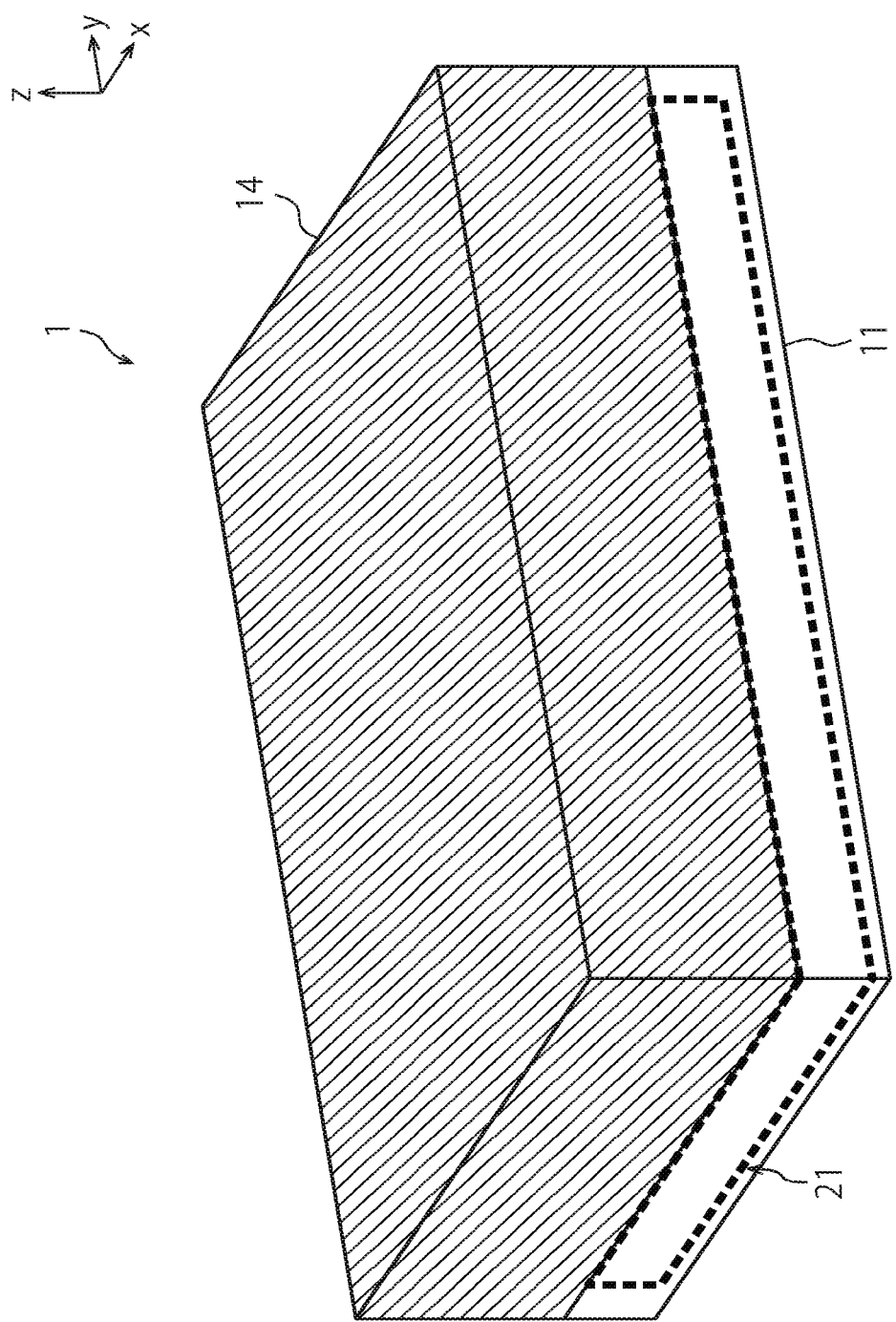
FIG. 8 is a perspective view illustrating a slot antenna formed in the second embodiment.

FIG. 8 is a perspective view illustrating a slot antenna formed in the second embodiment. An L-shaped slot antenna is formed so as to extend over the left side surface and the front side surface of the wireless module 1. In the example of FIG. 8, the feed line 15 is connected to the conductive film 14 on the left side surface of the wireless module 1 (insulator 13) as with the first embodiment. However, the slot antenna region 21 extends over the left side surface and the front side surface because the via 17B is connected to the conductive film 14 on the front side surface.

As described above, the conductive film 14 forming the slot antenna according to the present embodiment covers the insulator 13 over the two side surfaces, and the first layer conductor pattern 16A and the first layer conductor pattern 16B are in contact with the conductive film 14 on the two different side surfaces. Accordingly, the slot antenna is formed so as to extend over the two side surfaces. Hence, it is possible to secure sufficient length of the slot antenna even in a case where the length of the slot antenna in one side surface is insufficient. Consequently, this makes it possible to adjust a usable frequency band of the slot antenna.

Incidentally, the example in which the slot antenna extends over the two side surfaces has been described above. However, it is also possible to form the slit antenna extending over three or four side surfaces by adjusting the positions of the respective first layer conductor patterns 16 and the shape of the second layer conductor pattern 18.

As described above, in the second embodiment, forming the slot antenna extending over the plurality of side surfaces makes it possible to secure the length of the outer periphery of the slot antenna and to widen the usable frequency band.

Third Embodiment

In a third embodiment, in a case where the length of the outer periphery of the slot antenna is small, an opening section (uncovered part) is provided in the conductive film 14 without changing the wiring pattern from the first embodiment, and the opening section is connected to the slot antenna region 21 on the side surface of the interposer board 11 so as to operate as one slot antenna. As a result, the length of the slot antenna is increased, which realizes the slot antenna with high radiation efficiency at a frequency lower than the frequency of the first embodiment.

Figure 9:
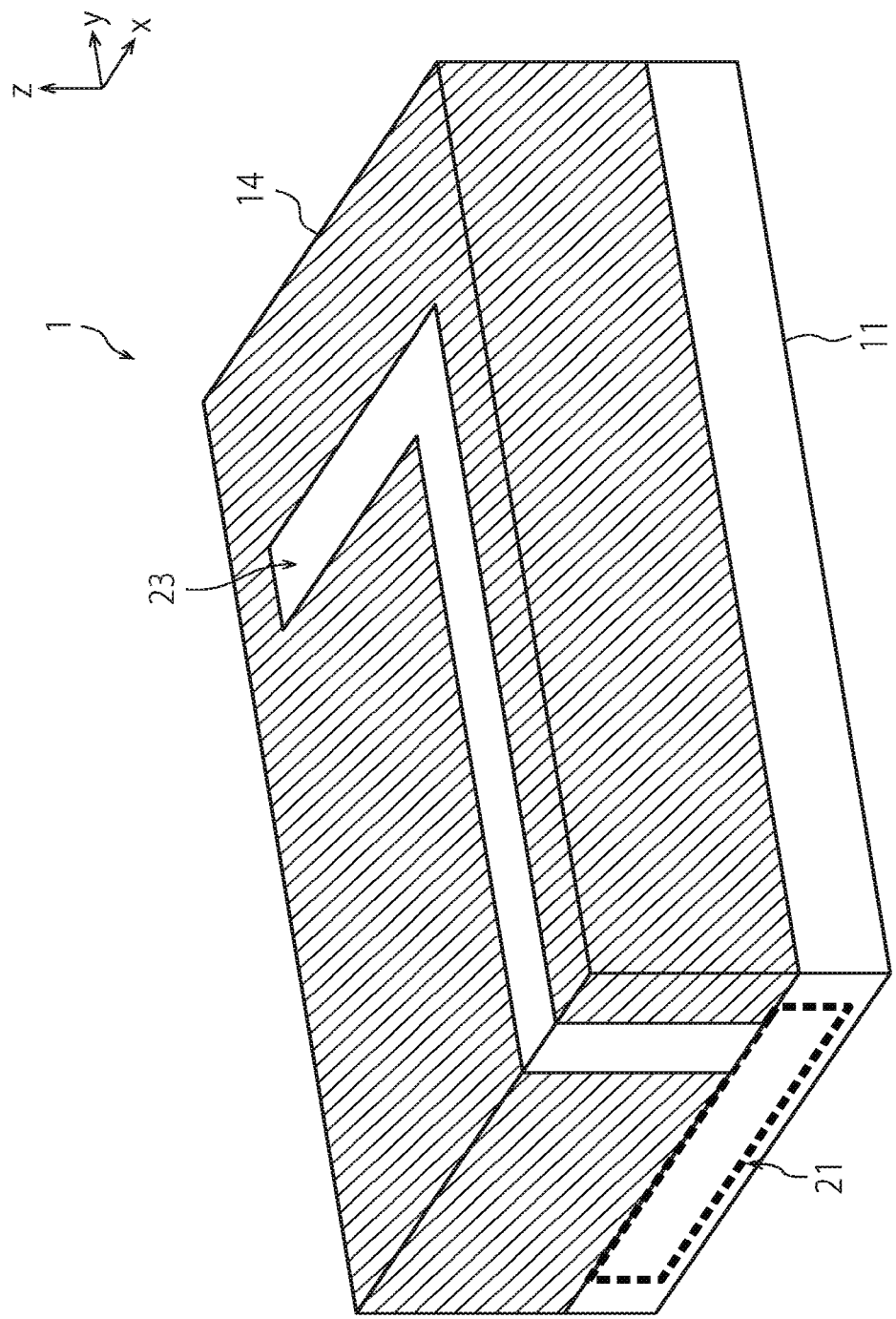
FIG. 9 is a perspective view illustrating an opening section formed in a third embodiment.

FIG. 9 is a diagram illustrating the opening section formed in the third embodiment. An opening section 23 is formed in the conductive film 14 so as to extend over the left side surface and a top surface of the wireless module 1. In addition, the opening section 23 is connected to the slot antenna region 21 on the side surface of the interposer board 11. As a result, the slot antenna formed in the third embodiment is a combination of the opening section and the slot antenna that is formed in the case where the opening section is not provided. This makes it possible to increase the outer periphery of the slot antenna formed in the third embodiment.

Incidentally, an unnecessary electromagnetic wave in a specific frequency band may be leaked from the opening section in the third embodiment. Accordingly, it is necessary to consider a frequency of noise radiated from the inside of the package and the position of the opening section. For example, the leakage of the unnecessary electromagnetic wave from the opening section is likely to occur in the frequency band higher than the resonance frequency of the slot antenna. When a frequency of a clock inside the package is set to a frequency sufficiently lower than the resonance frequency of the slot antenna, intensity of harmonics of the clock is also sufficiently lowered at the frequency at which the leakage of the unnecessary electromagnetic wave is likely to occur. Hence, the leakage of the unnecessary electromagnetic wave may not cause a problem. Further, when the semiconductor chip 12, which is a radiation source, is not located directly below the opening section 23, the leakage of the unnecessary electromagnetic wave may not cause a problem.

Moreover, the unnecessary electromagnetic wave does not interfere with the wiring pattern of the printed circuit board at a lower part of the wireless module 1 because the opening section 23 is provided at an upper part of the wireless module 1. Accordingly, it is possible to arrange an electronic component directly below the wireless module 1 while reducing the wiring prohibited region in the printed circuit board as with the first embodiment.

As described above, in the third embodiment, the opening section 23 of the conductive film 14 is provided at least any of the side surface and the top surface of the wireless module, and the opening section 23 is connected to the slot antenna region 21 on the side surface of the interposer board. This makes it possible to secure the length of the slot antenna and to widen the usable frequency band.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A wireless module, comprising:
a board including at least a first wiring layer and a second wiring layer;
a semiconductor chip located on the first wiring layer and configured to at least transmit or receive a high-frequency signal;
an insulator having a first side surface encapsulating the semiconductor chip;
a conductive film covering at least a part of the first side surface of the insulator;
a feed line located on the first wiring layer and electrically connected to the semiconductor chip and the conductive film;
first and second conductor patterns located on the first wiring layer and being in contact with the conductive film;
a third conductor pattern of a ground potential located on the second wiring layer;
a first via connecting electrically the first conductor pattern and the third conductor pattern; and
a second via connecting electrically the second conductor pattern and the third conductor pattern.
2. The wireless module according to claim 1, wherein, a slot antenna is formed by an end part of the conductive film, an end part of the third conductor pattern, the first via, and the second via when the high-frequency signal is transmitted from the semiconductor chip to the conductive film through the feed line.

3. The wireless module according to claim 2, wherein an excited electric field of the slot antenna has a main part in a direction parallel to a thickness direction of the first wiring layer.

4. The wireless module according to claim 2, wherein a resonance frequency of the slot antenna is adjusted by a position of the first via and a position of the second via.

5. The wireless module according to claim 2, wherein:
the insulator includes a second side surface;
the conductive film covers at least a part of the insulator over the first side surface and the second side surface;
the first conductor pattern is in contact with the conductive film on the first side surface;
the second conductor pattern is in contact with the conductive film on the second side surface; and
the slot antenna is formed to extend over the first side surface and the second side surface.

6. The wireless module according to claim 2, wherein:
the insulator has an uncovered part that is not covered with the conductive film; and
a part of the end part of the conductive film forming the slot antenna is connected to the uncovered part.

7. The wireless module according to claim 6, wherein the uncovered part is provided also on a side surface other than the first side surface of the insulator.

8. The wireless module according to claim 6, wherein the uncovered part is provided also on a top surface of the insulator.

9. The wireless module according to claim 8, wherein the semiconductor chip is not located directly below the uncovered part that is provided on the top surface of the insulator.

10. The wireless module according to claim 6, wherein a frequency of a clock of the semiconductor chip is lower than a resonance frequency of the slot antenna.

11. The wireless module according to claim 1, wherein the conductive film covers the entire first side surface of the insulator.

12. A printed circuit board comprising:
a printed wiring board including a first surface and a second surface opposite to the first surface;
the wireless module according to claim 1 located on the first surface; and
an electronic component located on the second surface.

13. The printed circuit board according to claim 12, wherein the electronic component is located directly below the wireless module.

14. The printed circuit board according to claim 12, wherein a wiring prohibited region is not provided directly below the wireless module.

15. The printed circuit board according to claim 12, wherein a side surface of the wireless module including the first side surface is separated by a distance of 1 mm or less from an outer periphery of the printed wiring board.

16. A method of manufacturing the wireless module according to claim 1, the method comprising:
forming an insulator on an entire top surface of one sheet-like printed circuit board in which sets of components of the wireless modules are spaced at a predetermined interval, each of the sets including the semiconductor chip, the feed line, the first conductor pattern, the second conductor patter, the third conductor pattern, the first via, and the second via;
forming a groove that extends over the insulator and a part of the sheet-like printed circuit board at every boundary of regions provided for the respective component sets;
forming the conductive film on the insulator and in the groove; and
dividing, along the groove, the sheet-like printed circuit board into small pieces.

* * * * *